United States Patent
Huang et al.

(10) Patent No.: US 7,755,735 B2
(45) Date of Patent: Jul. 13, 2010

(54) PIXEL STRUCTURE OF LIQUID CRYSTAL DISPLAY PANEL AND METHOD HAVING FIRST AND SECOND PATTERNED CONDUCTIVE LAYERS HAVING RESPECTIVELY FIRST AND SECOND DATA LINE SECTIONS AND WITH SECOND PATTERNED CONDUCTIVE LAYER ADDITIONALLY INCLUDING SOURCE, DRAIN, AND A FLOATING LIGHT-SHIELDING PATTERN DISPOSED OVER THE FIRST DATA LINE SECTION

(75) Inventors: Kuo-Yu Huang, Hsin-Chu (TW); Ke-Chih Chang, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 230 days.

(21) Appl. No.: 12/116,192

(22) Filed: May 6, 2008

(65) Prior Publication Data

US 2009/0185089 A1  Jul. 23, 2009

(30) Foreign Application Priority Data

Jan. 17, 2008  (TW) .............................. 97101772 A (51) Int. Cl.
*G02F 1/1343* (2006.01)

(52) U.S. Cl. .................... 349/139; 349/38; 349/111; 349/140

(58) Field of Classification Search ............. 349/38, 349/39, 111, 139, 140, 141
See application file for complete search history.

(56) References Cited

U.S. PATENT DOCUMENTS

| 5,936,685 A | 8/1999 | Ito |
| 6,067,131 A * | 5/2000 | Sato ............................ 349/43 |
| 6,633,359 B1 * | 10/2003 | Zhang et al. ................ 349/141 |

* cited by examiner

*Primary Examiner*—John Heyman
(74) *Attorney, Agent, or Firm*—Winston Hsu (57) ABSTRACT

A pixel structure of a liquid crystal display panel includes a scan line, a data line, a thin film transistor (TFT), a pixel electrode, a light-shielding pattern, and a common line. The data line includes a first data line section and a second data line section composed respectively of the first material layer and second material layer and electrically connected to each other through a plurality of contact plugs. In addition, the pixel electrode is electrically connected to a drain of the TFT, and the light-shielding pattern, which is a floating metal, is disposed over the first data line section. The common line, the light-shielding pattern, and the second data line section are composed of the same material layer.

28 Claims, 10 Drawing Sheets

PIXEL STRUCTURE OF LIQUID CRYSTAL DISPLAY PANEL AND METHOD HAVING FIRST AND SECOND PATTERNED CONDUCTIVE LAYERS HAVING RESPECTIVELY FIRST AND SECOND DATA LINE SECTIONS AND WITH SECOND PATTERNED CONDUCTIVE LAYER ADDITIONALLY INCLUDING SOURCE, DRAIN, AND A FLOATING LIGHT-SHIELDING PATTERN DISPOSED OVER THE FIRST DATA LINE SECTION

BACKGROUND OF THE INVENTION

1. Field of the Invention

The present invention relates to a pixel structure of liquid crystal display panel and method of making the same, and more particularly, to a pixel structure of liquid crystal display panel capable of reducing cross talk and method of making the same.

2. Description of the Prior Art

Pixel aperture ratio of an LCD device directly influences the utilization rate of backlight and display brightness. One of the major factors that decide the aperture ratio is the distance between the transparent pixel electrode and the data line, and this distance must be reduced if a larger aperture ratio is desired. However, if the transparent pixel electrode and the data line are too approximate, the parasitic capacitance between pixel and data line (Cpd) will increase. When the Cpd increases, the charges charged in the pixel electrode will lead to cross talk when different voltage signals are delivered by the data line. In addition, if the common line and the data line are too approximate, the parasitic capacitance between the common line and the data line will also increase. This may also lead to cross talk.

In order to reduce the Cpd effect, several solutions have been proposed. For example, increasing the storage capacitance can reduce the ratio of the Cpd with respect to the total capacitors of a sub-pixel. In addition, the parasitic capacitance can be reduced when there is a stable electrical field between the data line and the pixel electrode. Also, Optical Imaging Systems (OIS) has proposed a method for reducing the capacitance between the data line and the pixel electrode by coating an organic insulator film (K=2.7~3.5) through the use of the photo-imaged and spin on glass (SOG) methods. This method reduces the capacitance effect between the data line and the pixel electrode, so as to allow the pixel electrode to overlap the data line.

However, all of these methods suffer from some disadvantages, for example, increasing the storage capacitor would affect the aperture ratio of the pixel structure. The organic insulator film has the disadvantages of water absorption, yellowing, and poor interface adhesion. These disadvantages would affect the yield and the throughput.

SUMMARY OF THE INVENTION

It is therefore one object of the claimed invention to provide a pixel structure of a liquid crystal display panel and method of making the same to reduce cross talk.

According to the claimed invention, a method of forming a pixel structure is provided. The method includes the following steps. A substrate is provided, and a first patterned conductive layer is formed on the substrate. The first patterned conductive layer includes a scan line, a gate, and a first data line section, and the gate is electrically connected to the scan line. Subsequently, an insulating layer is formed on the first patterned conductive layer. The insulating layer includes a plurality of first contact holes disposed over the first data line section. Then, a second patterned conductive layer is formed on the insulating layer and the second patterned conductive layer is filled into the first contact holes to form a plurality of first contact plugs, wherein the second patterned conductive layer includes a second data line section, a source, a drain, and a light-shielding pattern, and the second data line section is electrically connected to the source, and electrically connected to the first data line section via the first contact plugs. The light-shielding pattern is a floating metal, partially overlapping the first data line section. Afterward, a dielectric layer is formed on the second patterned conductive layer, and a pixel electrode is formed on the dielectric layer, wherein the pixel electrode is electrically connected to the drain.

According to the claimed invention, a pixel structure is provided. The pixel structure includes a substrate, a first patterned conductive layer disposed on the substrate, an insulating layer disposed on the first patterned conductive layer, a second patterned conductive layer disposed on the insulating layer, a plurality of first contact plugs disposed in the first contact holes, a pixel electrode electrically connected to the drain, and at least a dielectric layer disposed between the second patterned conductive layer and the pixel electrode. The first patterned conductive layer includes a scan line, a gate electrically connected to the scan line, and a first data line section. The insulating layer includes a plurality of first contact holes. The second patterned conductive layer includes a second data line section, a source electrically connected to the second data line section, a drain, a common line, and a light-shielding pattern. The light-shielding pattern is a floating metal, partially overlapping the first data line section. The second data line section is electrically connected to the first data line section via the first contact plugs.

According to the claimed invention, a pixel structure is provided. The pixel structure includes a scan line, a data line crisscrossed with the scan line, a thin film transistor, a light-shielding pattern, and a common line, parallel to the scan line, disposed between the light-shielding pattern and the thin film transistor. The data line at least includes a first data line section and a second data line section. The first data line section includes a first material layer, the second data line section includes a second material layer, and the first data line section and the second data line section are electrically connected together via a plurality of contact plugs. The thin film transistor is electrically connected to the scan line and the second data line section. The light-shielding pattern is disposed over the first data line section, and the light-shielding pattern is a floating metal. The common line, the light-shielding pattern and the second data line section are made of a same material layer.

The distance between the first data line section of the data line and the pixel electrode is enlarged, and this enlarged distance reduces cross talk and the parasitic capacitance between the data line and the pixel electrode. In addition, the pixel structure of the present invention uses the light-shielding pattern made of the second patterned conductive layer to shield the light leakage in the periphery region of the data line. The light-shielding pattern may generate a parasitic capacitance, but may also shield the parasitic capacitance between the pixel electrode and the data line. By adjusting the length of the light-shielding pattern, the balance between these two parasitic capacitances can be found to optimize the display effect of the liquid crystal display panel. These and other objectives of the present invention will no doubt become obvious to those of ordinary skill in the art after reading the following detailed description of the preferred embodiment that is illustrated in the various figures and drawings.

DETAILED DESCRIPTION

Figure 1:
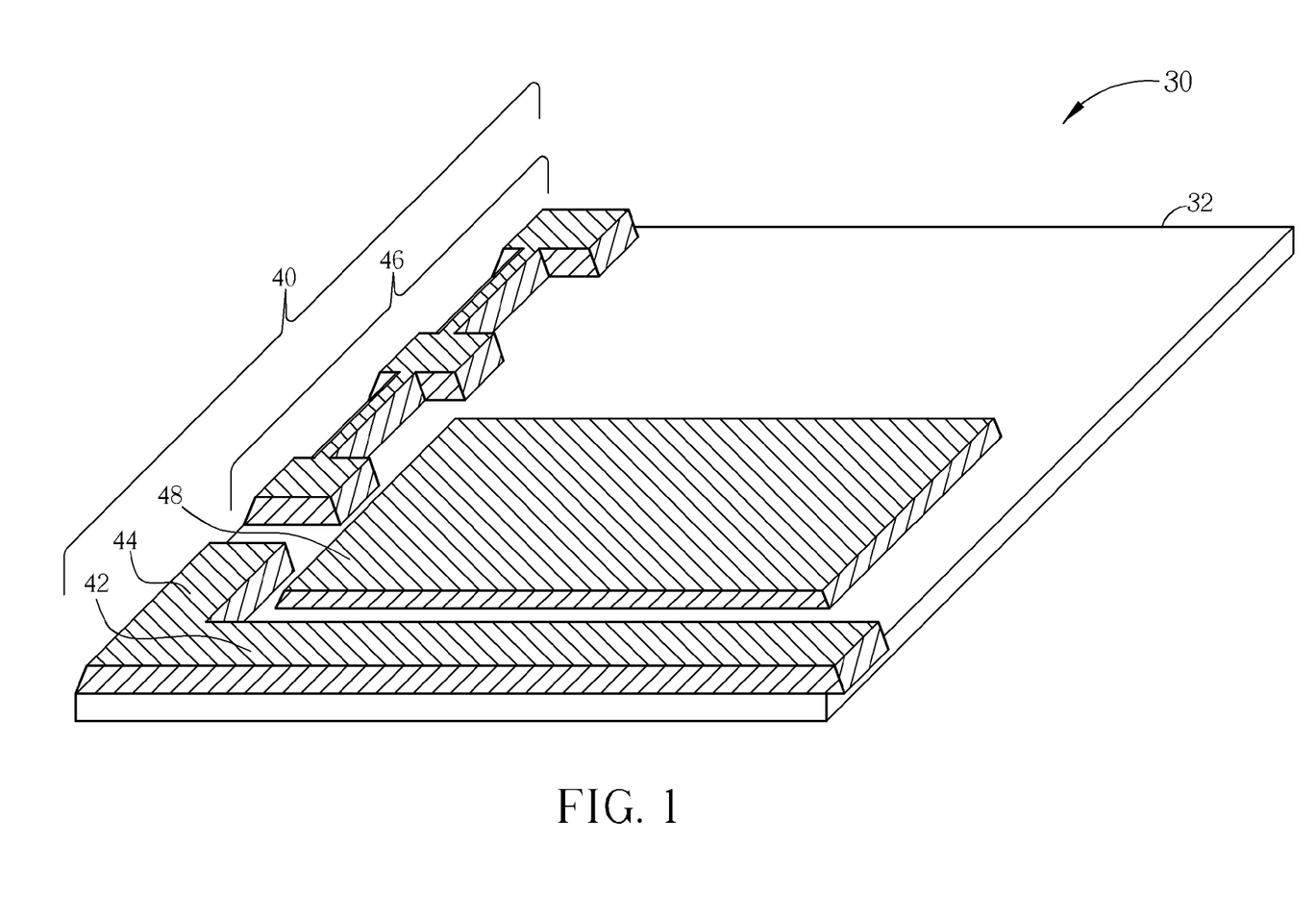
FIGS. 1-8 schematically illustrates a pixel structure of a liquid crystal display panel in accordance with a preferred embodiment of the present invention.
Figure 2:
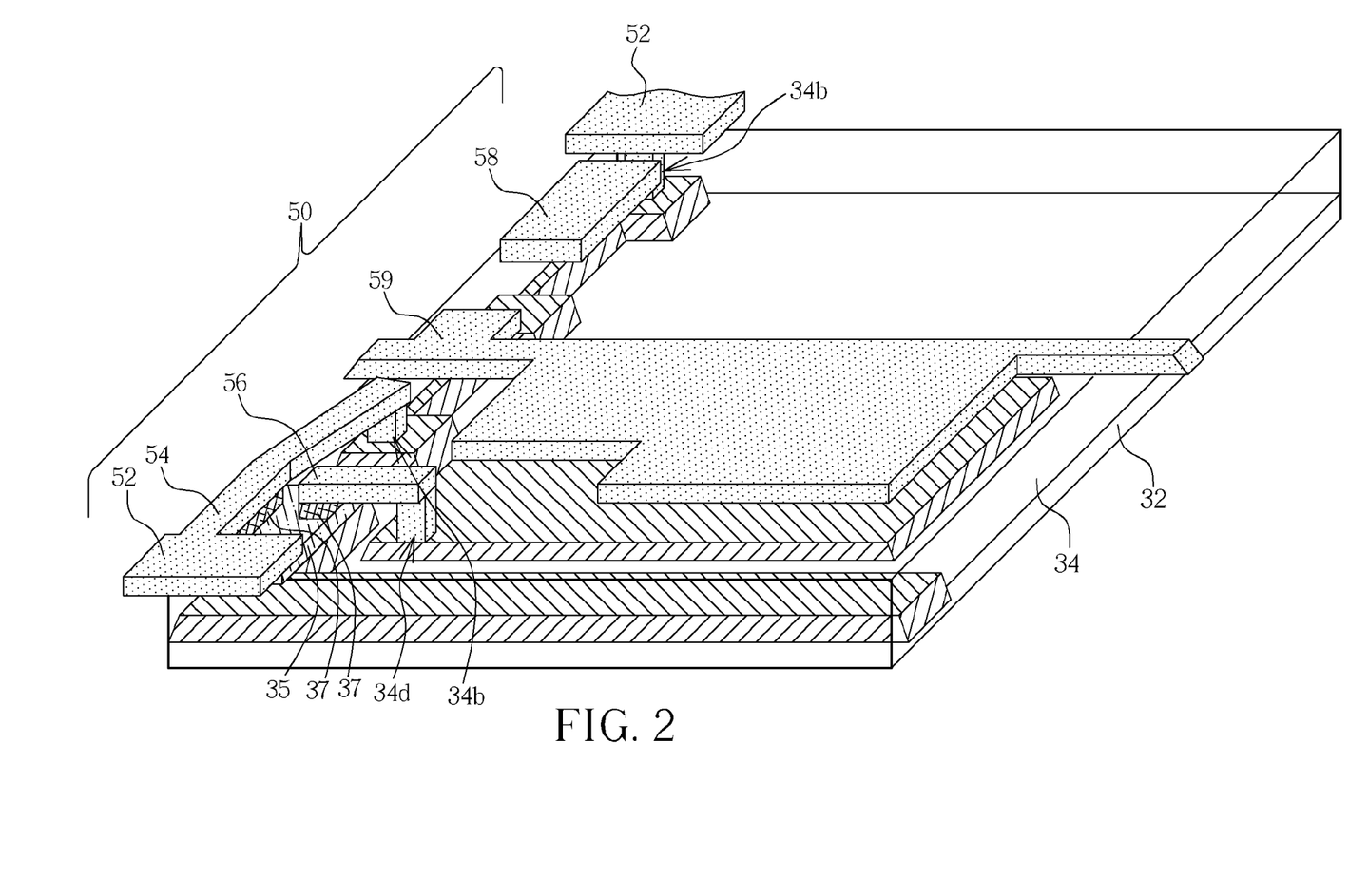
Figure 3:
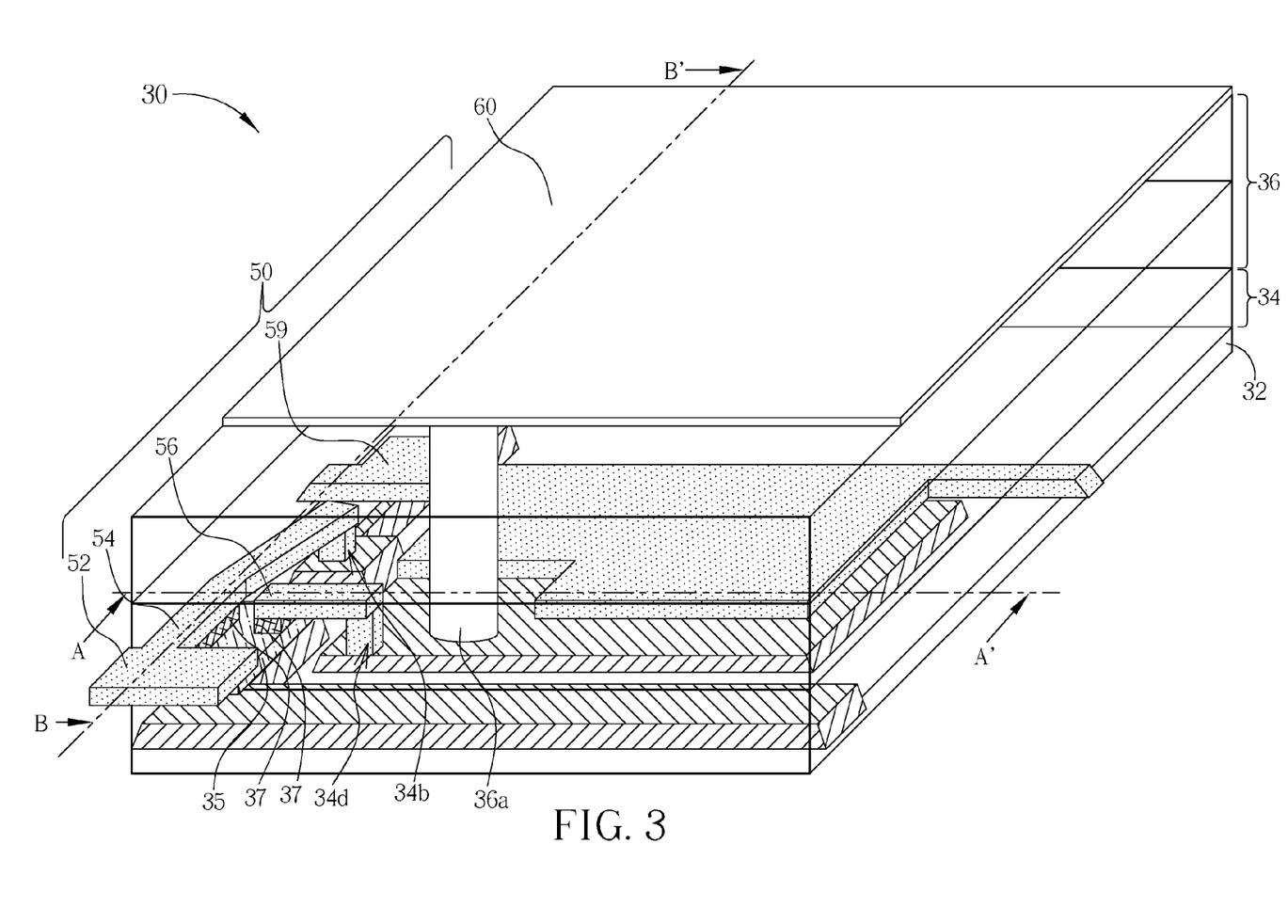
Figure 4:
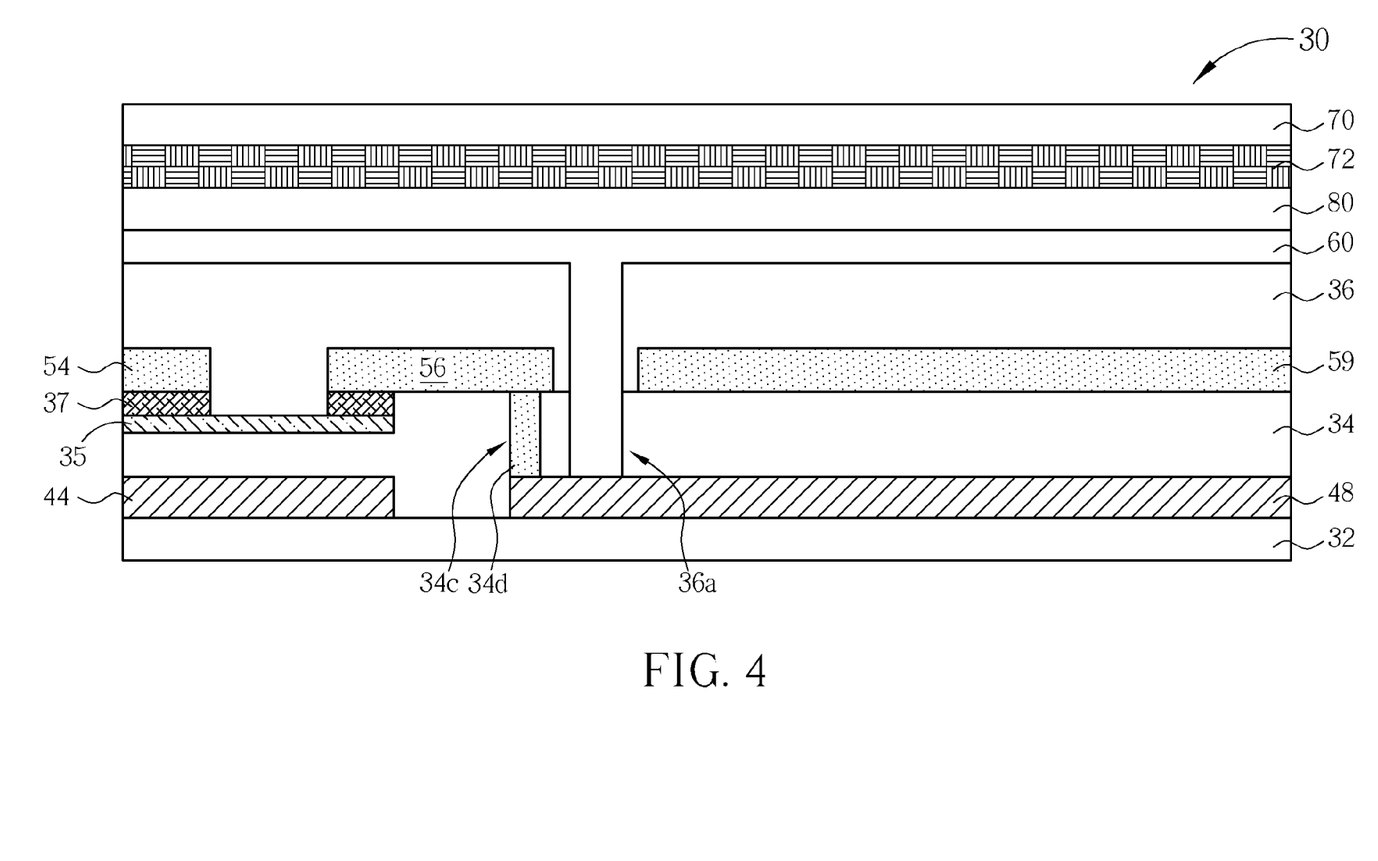
Figure 5:
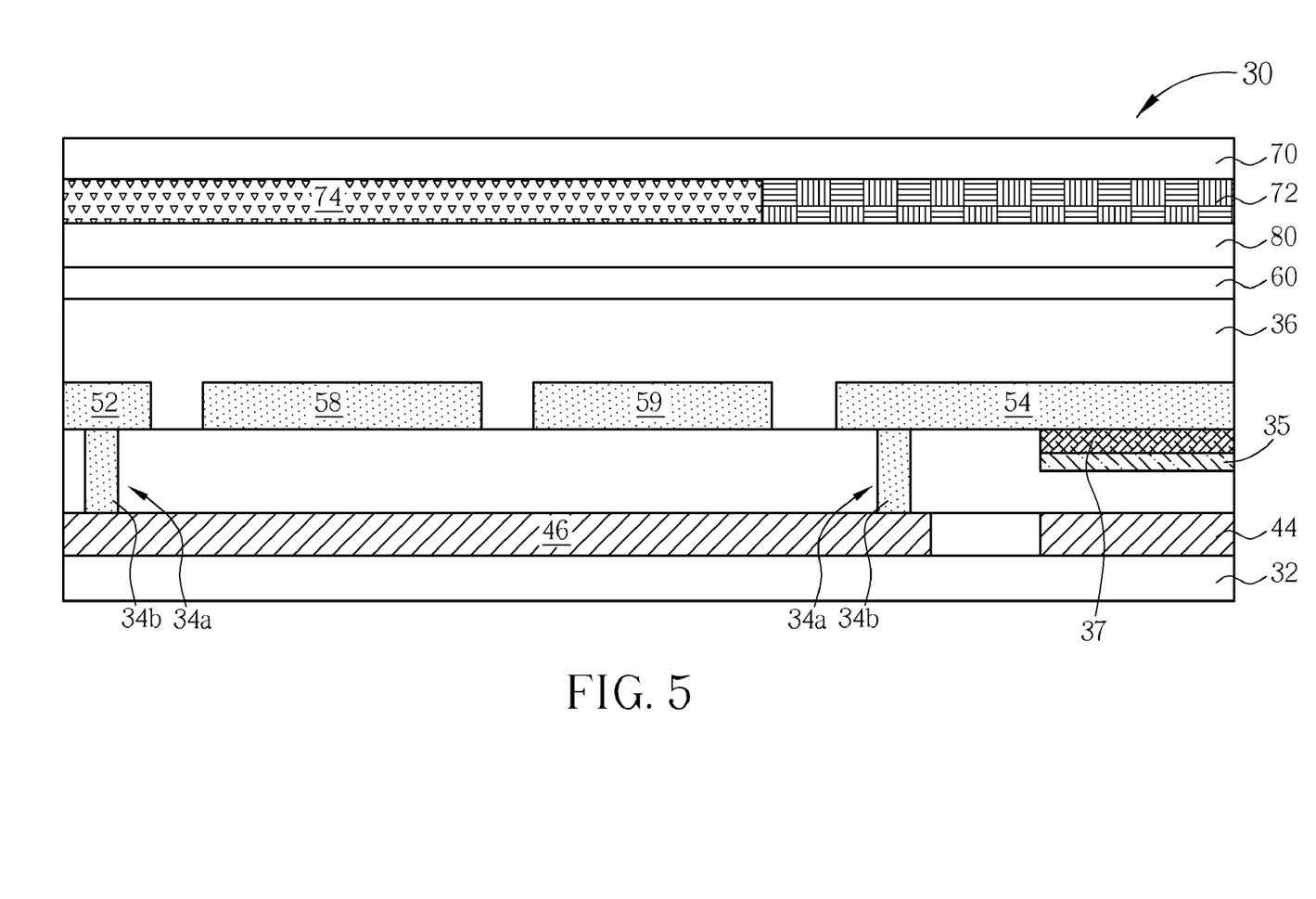
Figure 6:
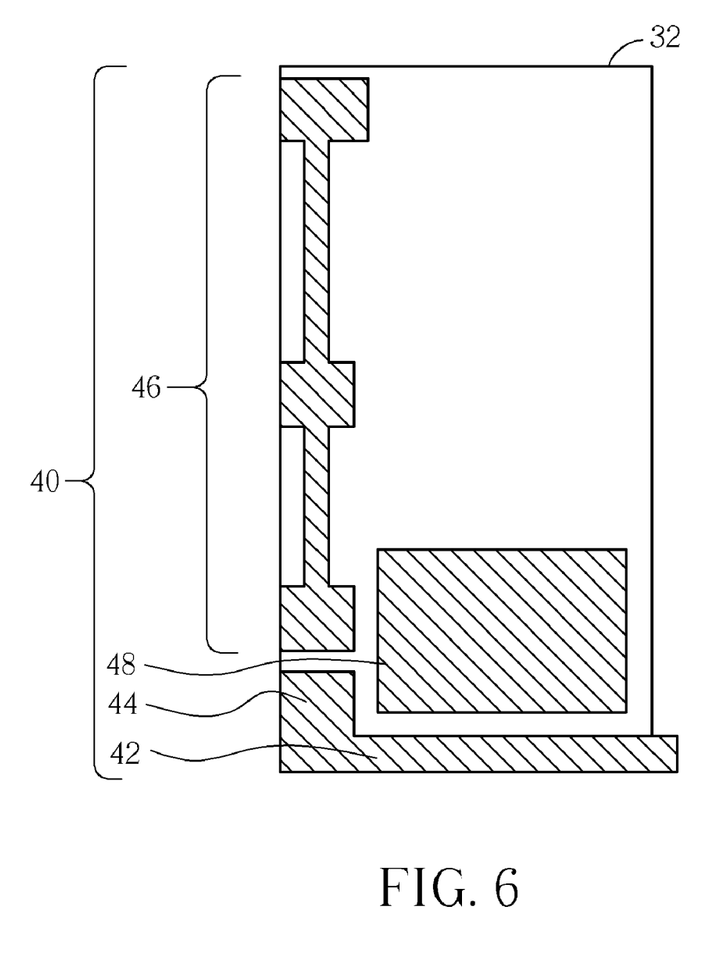
Figure 7:
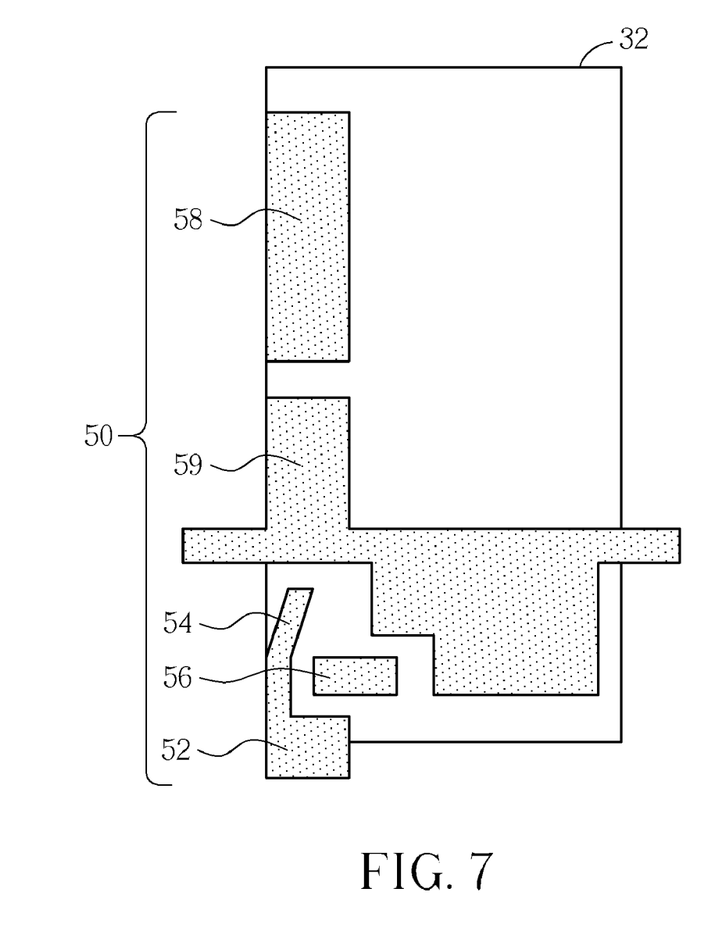
Figure 8:
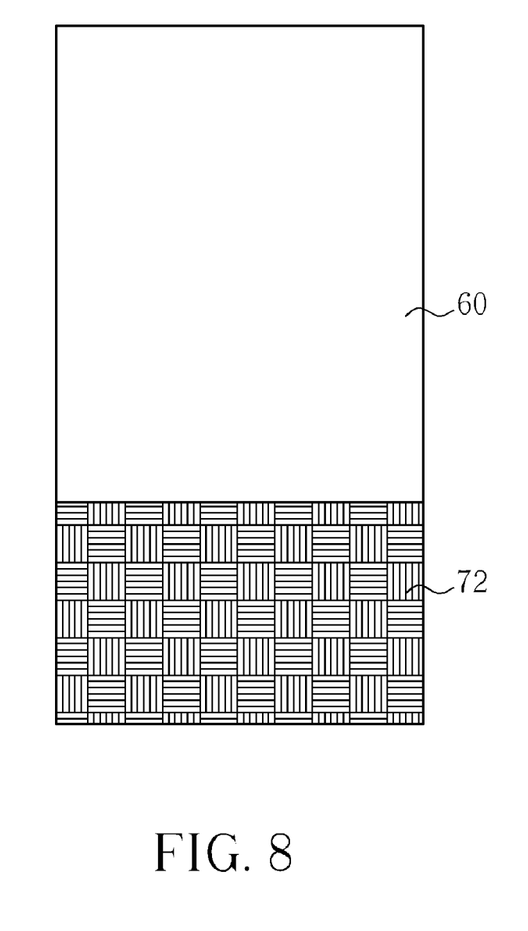

Please refer to FIGS. 1-8. FIGS. 1-8 schematically illustrates a pixel structure of a liquid crystal display panel in accordance with a preferred embodiment of the present invention. In the drawings, only one of many pixel structures in the liquid crystal display panel is drawn for better demonstrating the present invention. FIGS. 1-3 are oblique views illustrating a method of forming the pixel structure, where top substrate and liquid crystal layer are not shown. FIG. 4 is a cross-sectional view of the pixel structure of FIG. 3 along a tangent line AA', and FIG. 5 is a cross-sectional view of the pixel structure of FIG. 3 along a tangent line BB'. FIG. 6 illustrates a layout of a first patterned conductive layer, FIG. 7 illustrates a layout of a second patterned conductive layer, and FIG. 8 illustrates a layout of a pixel electrode and a light-shielding pattern.

As shown in FIG. 1, a substrate (also referred to as bottom substrate or first substrate) 32 is provided, and a first patterned conductive layer 40 is formed on the substrate 32. The substrate 32 is a transparent substrate, e.g. a glass substrate or a quartz substrate. The first patterned conductive layer 40 is made of a first material layer, e.g. a metal layer, which has good conductivity. The layout of the first patterned conductive layer 40 in a single pixel is shown in FIG. 6, which includes a scan line 42, a gate 44, a first data line section 46, and an electrode pattern 48. The gate 44 is electrically connected to the scan line 42, but the gate 44, the first data line section 46, and the electrode pattern 48 are electrically disconnected. In this embodiment, the first data line section 46 includes three wide blocks, which are wider than other parts of the first data line section 46. The wide blocks on two opposite sides of the first data line section 46 are used to dispose contact holes for a larger tolerance of the wide blocks. The wide block in the middle of the first data line section 46 has light-shielding effect.

As shown in FIGS. 2, 4 and 5, an insulating layer 34 is formed on the first patterned conductive layer 40, and two first contact holes 34a and one second contact hole 34c are formed in the insulating layer 34. The two first contact holes 34a are corresponding to the wide blocks on the opposite sides of the first data line section 46, and the second contact hole 34c is corresponding to the electrode pattern 48. Subsequently, a semiconductor layer 35 is formed on the surface of the insulating layer 34 corresponding to the gate 44. The area of the semiconductor layer 35 is required to be large enough to cover the gate 44 to serve as a channel region. The insulating layer 34 disposed between the gate 44 and the semiconductor layer 35 serves as a gate insulating layer. Subsequently, an ohmic contact layer 37 is formed on the semiconductor layer 35, and a second patterned conductive layer 50 is formed on the ohmic contact layer 37 and the insulating layer 34. The layout of the second patterned conductive layer 50 in a single pixel is shown in FIG. 7, which includes a second data line section 52, a source 54 connected to the second data line section 52, a drain 56, a light-shielding pattern 58, and a common line 59. The second patterned conductive pattern 50 is made of a second material layer, e.g. a metal layer, which has good conductivity. The relative position of each pattern of the second patterned conductive layer 50 is clearly shown in FIG. 2. In the step of forming the second patterned conductive layer 50, the second patterned conductive layer 50 is filled into the first contact holes 34a to form first contact plugs 34b, and filled into the second contact hole 34c to form a second contact plug 34d. The first contact plug 34b adjacent to the gate 44 is used to electrically connect the source 54 and the first data line section 46 together, while the other first contact plug 34b is used to electrically connect the first data line section 46 and the second data line section 52 of a neighboring pixel. In addition, the second contact plug 34d is used to electrically connect the drain 56 and the electrode pattern 48. The source 54 and the drain 56 of the second patterned conductive layer 50 and the semiconductor layer 35 are interposed with the ohmic contact layer 37, and the gate 44, the semiconductor layer 35, the source 54, and the drain 56 compose a thin film transistor.

The common line 59 is mainly disposed over the electrode pattern 48, and extended to the top of parts of the first data line section 46. Also, the common line 59 is disposed between the light-shielding pattern 58 and the thin film transistor, and parallel to the scan line 42. The light-shielding pattern 58 is disposed over the first data line section 46, and partially overlapping the first data line section 46 so as to shield the light leakage in the periphery of the first data line section 46. In addition, the light-shielding pattern 58 and the common line 59 are gapped with a space, which makes the light-shielding pattern 58 a floating metal and electrically disconnect to the common line 59.

As shown in FIG. 3, at least a dielectric layer 36 is formed on the second patterned conductive layer 50, and at least a third contact hole 36a is formed in the dielectric layer 36. The third contact hole 36a is disposed over the electrode pattern 48, and adjacent to the drain 56 and the common line 59 of the second patterned conductive layer 50. In this embodiment, the common line 59 has a truncated region with respect to the third contact hole 36a, and the insulating layer 34 has an opening corresponding to the third contact hole 36a so that the electrode pattern 48 corresponding to the third contact hole 36a can be exposed. Subsequently, a pixel electrode 60 is formed on the surface of the dielectric layer 36, and the pixel electrode 60 is filled into the third contact hole 36a to electrically connect to the electrode pattern 48 without short-circuiting the common line 59. Since the electrode pattern 48 is electrically connected to the drain 56 via the second contact plug 34d, the pixel electrode 60 therefore can be electrically connected to the drain 56. The dielectric layer 36, also referred to passivation layer, is made of insulating material, and can be a single-layered dielectric layer or a multi-layered composite dielectric layer wherever necessary. The dielectric layer 36 may be inorganic material e.g. silicon oxide, silicon nitride, or organic material e.g. epoxy resin, multi-layered composite structure made of merely inorganic material, multi-layered composite structure made of merely organic material, or multi-layered composite structure made of inorganic and organic material. The pixel electrode 60 may be made of transparent conductive material e.g. indium tin oxide (ITO).

As shown in FIGS. 4, 5 and 8, another substrate (also referred to as top substrate or second substrate) 70 having a patterned light-shielding matrix (also referred to as black matrix, BM) 72 and a color filter unit 74 is provided. The substrate 70 and the substrate 32 are then bonded together, and a liquid crystal layer 80 is interposed therebetween to form a pixel structure 30 of a liquid crystal display panel. The substrate 32 may include an alignment film, and the substrate 70 may include an alignment film, a common electrode, or other necessary components, which is well known to those skilled in the art and not redundantly described.

The pixel structure 30 includes two storage capacitors, where the common line 59, the pixel electrode 60 and the dielectric layer 36 disposed therebetween compose a first storage capacitor, and the electrode pattern 48, the common line 59 and the insulating layer 34 disposed therebetween compose a second storage capacitor. The first storage capacitor is a MII (Metal-Insulator-ITO) storage capacitor, and the second storage capacitor is a MIM (Metal-Insulator-Metal) storage capacitor.

The first data line section 46 is shielded by the light-shielding pattern 58 disposed on the substrate 32, and thus the patterned light-shielding matrix 72 disposed on the other substrate 70 is corresponding to the thin film transistor, the storage capacitors and the switching device (as shown in FIGS. 4 and 8), but is not required to correspond to the first data line section 46. This also prevents the light leakage due to misalignment of the patterned light-shielding matrix 72. As for the portion of the first data line section 46 not covered by the light-shielding pattern 58, the light can be shielded by the wide block of the first data line section 46. In addition, the color filter unit 74 is disposed corresponding to the display region of the pixel structure, including the light-shielding pattern 58 (as shown in FIG. 5).

One of the features of the pixel structure 30 of the liquid crystal display panel is that the first data line section 46 is part of the first patterned conductive layer 40, but not part of the second patterned conductive layer 50. By virtue of this design, the distance between the first data line section 46 and the pixel electrode 60 is relatively enlarged. In addition, the light-shielding pattern 58 of the second patterned conductive layer 50 can provide shielding effect. Thus, the parasitic capacitance between the pixel electrode 60 and the first data line section 46 and the cross talk can be effectively reduced. Furthermore, the second patterned conductive layer 50 includes the light-shielding pattern 58 corresponding to the first data line section 46. The light-shielding pattern 58 can shield the light leakage in the periphery of the first data line section 46, and therefore the patterned light-shielding matrix is not required in this area. This increases the pixel aperture ratio and prevents the light leakage due to the misalignment of the patterned light-shielding matrix. Moreover, the area ratio of the overlapping area between the light-shielding pattern 58 and the first data line section 46 to the area of the first data line section 46 uncovered by the light-shielding pattern 58 may be controlled by modifying the length and width of the light-shielding pattern 58. The area adjustment of the light-shielding pattern 58 can balance the parasitic capacitance between the common line 59 and the first data line section 46, and the parasitic capacitance between the first data line section 46 and the pixel electrode 60, which can improve display effect.

Figure 9:
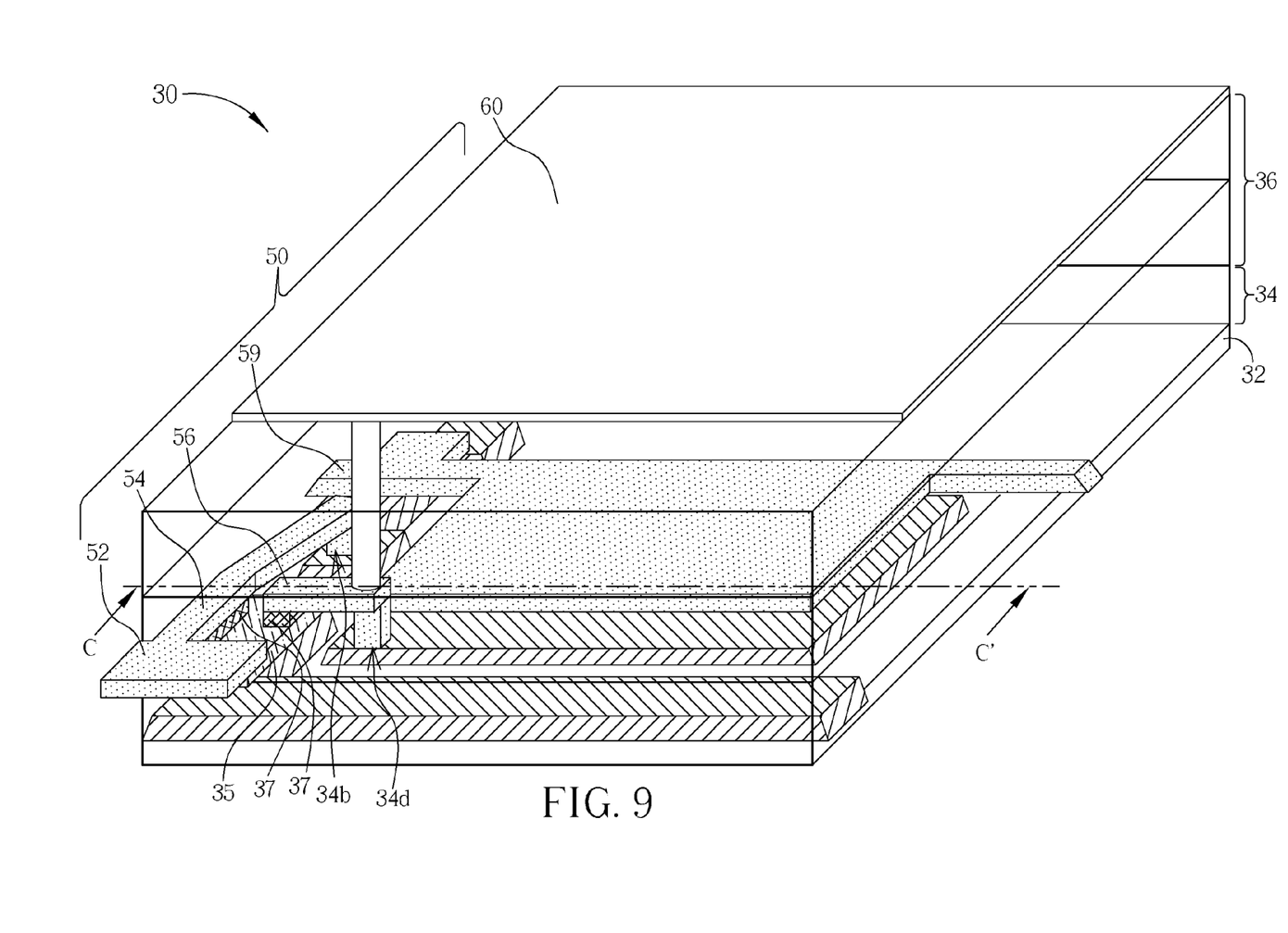
FIGS. 9-10 are schematic diagrams of a pixel structure of a liquid crystal display panel in accordance with another embodiment of the present invention.
Figure 10:
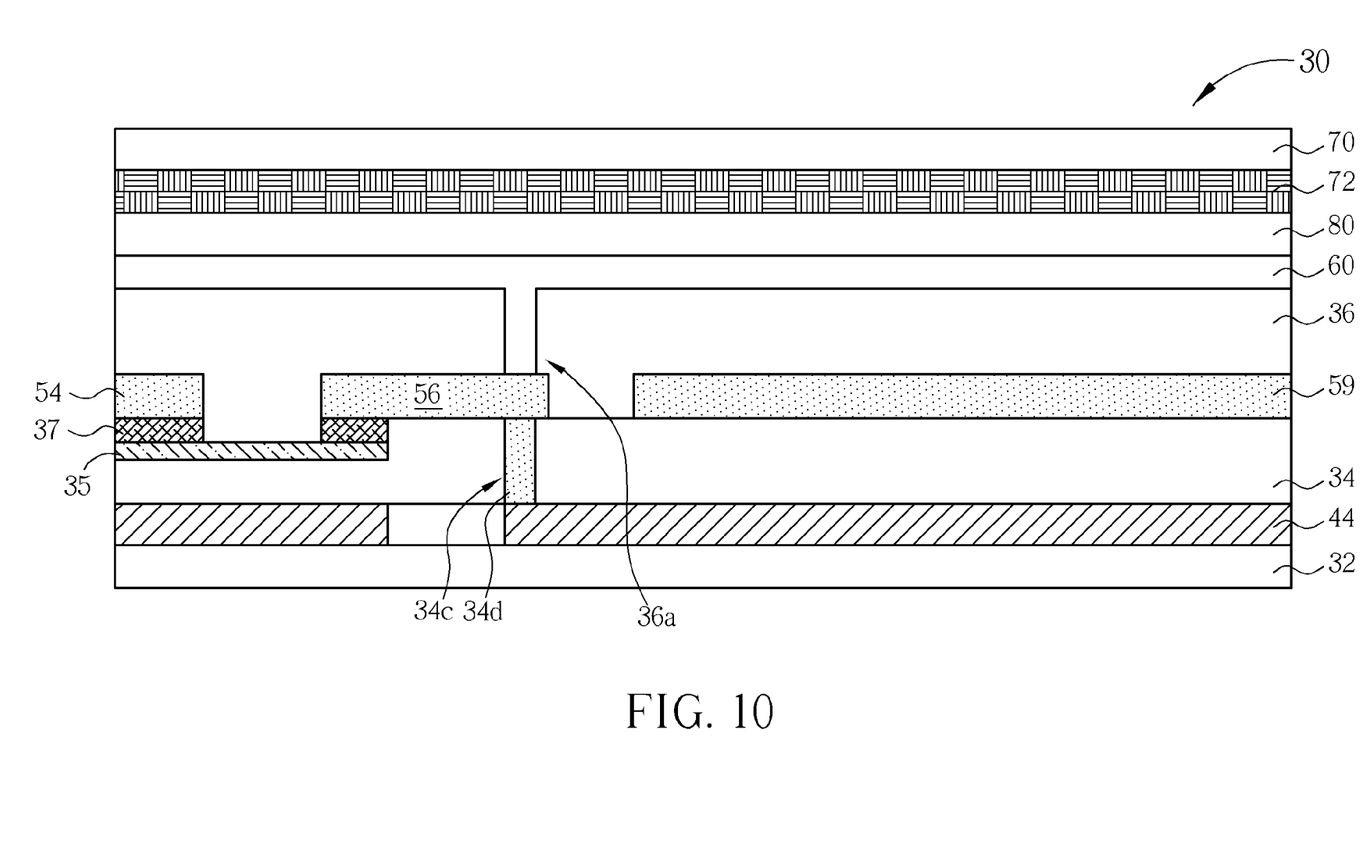

Please refer to FIGS. 9-10, as well as FIGS. 1, 2, and 5-8. FIGS. 9-10 are schematic diagrams of a pixel structure of a liquid crystal display panel in accordance with another embodiment of the present invention. FIG. 9 is an oblique view of the pixel structure, and FIG. 10 is a cross-sectional view of the pixel structure of FIG. 9 along a tangent line CC'. In this embodiment, the identical parts are denoted by the identical numerals, and are not redundantly described. As shown in FIGS. 9 and 10, the third contact hole 36a is disposed right over the drain 56, and therefore the pixel electrode 60 filled into the third contact hole 36a is directly electrically connected to the drain 56. The pixel electrode 60 is no longer required to electrically connect to the drain 56 via the electrode pattern 48. In this case, the common line 59 is not required to be truncated for accommodating the third contact hole 36a. Without requiring the truncated region, the boundary of the common line 59 adjacent to the display region may be drawn back, while the overlapping area between the common line 59 and the electrode pattern 48, and between the common line 59 and the pixel electrode 60 can remain the same. Accordingly, the total storage capacitance of the first storage capacitor formed by the pixel electrode 60, the common line 59 and the dielectric layer 36, and the second storage capacitor formed by the electrode pattern 48, the common line 56 and the insulating layer 34 can remain the same, but the pixel aperture ratio can be improved.

In this embodiment, it is appreciated that the electrode pattern 48 and the second contact hole 34c are optional based on different specification requirement. In some cases, the storage capacitance of the pixel structure 30 is provided only by the first storage capacitor.

In conclusion, the data line of the pixel structure of the liquid crystal display panel is made of the first patterned conductive layer and the second patterned conductive layer. These two conductive layers are not disposed in the same level, but are partially overlapping and electrically connected via contact plugs. This design reduces the parasitic capacitance between the data line and the pixel electrode due to the short distance between the pixel electrode and the data line made of the second patterned conductive layer. In addition, the pixel structure of the present invention uses the light-shielding pattern made of the second patterned conductive layer to shield the light leakage in the periphery region of the data line. The light-shielding pattern may generate a parasitic capacitance, but may also shield the parasitic capacitance between the pixel electrode and the data line. By adjusting the length of the light-shielding pattern, the balance between these two parasitic capacitances can be found to optimize the display effect of the liquid crystal display panel.

Those skilled in the art will readily observe that numerous modifications and alterations of the device and method may be made while retaining the teachings of the invention.

What is claimed is:

1. A method of forming a pixel structure, comprising:
   providing a substrate;
   forming a first patterned conductive layer on the substrate, wherein the first patterned conductive layer comprises a scan line, a gate, and a first data line section, wherein the gate is electrically connected to the scan line;
   forming an insulating layer on the first patterned conductive layer, wherein the insulating layer comprises a plurality of first contact holes disposed over the first data line section;
   forming a second patterned conductive layer on the insulating layer and filling the second patterned conductive layer into the first contact holes to form a plurality of first contact plugs, wherein the second patterned conductive layer comprises a second data line section, a source, a drain, and a light-shielding pattern, wherein the second data line section is electrically connected to the source, and electrically connected to the first data line section via the first contact plugs, the light-shielding pattern is a floating metal, partially overlapping the first data line section;
   forming a dielectric layer on the second patterned conductive layer; and
   forming a pixel electrode on the dielectric layer, wherein the pixel electrode is electrically connected to the drain.

2. The method of claim 1, further comprising forming a common line in the step of forming the second patterned conductive layer, wherein the common line and the light-shielding pattern is gapped with a space.

3. The method of claim 2, wherein the common line, the pixel electrode, and the dielectric layer disposed therebetween compose a first storage capacitor.

4. The method of claim 1, wherein the first patterned conductive layer further comprises an electrode pattern electrically connected to the drain.

5. The method of claim 4, wherein the electrode pattern, the common line, and the insulating layer disposed therebetween compose a second storage capacitor.

6. The method of claim 4, wherein the insulating layer further comprises a second contact hole disposed between the drain and the electrode pattern, and the step of forming the second patterned conductive layer further comprises filling the drain into the second contact hole to form a second contact plug to electrically connect the electrode pattern and the drain.

7. The method of claim 6, wherein the dielectric layer further comprises a third contact hole corresponding to the electrode pattern, the step of forming the pixel electrode further comprises filling the pixel electrode into the third contact hole to electrically connect to the electrode pattern, and the pixel electrode is electrically connected to the drain via the electrode pattern and the second contact plug.

8. The method of claim 1, wherein the dielectric layer further comprises a third contact hole disposed on the drain, and the step of forming the pixel electrode further comprises filling the pixel electrode into the third contact hole to electrically connected to the drain.

9. The method of claim 1, wherein the first data line section at least comprises a plurality of wide blocks, and the plurality of first contact holes are disposed over and corresponding to the wide blocks.

10. A pixel structure, comprising:
a substrate;
a first patterned conductive layer disposed on the substrate, the first patterned conductive layer comprising a scan line, a gate electrically connected to the scan line, and a first data line section;
an insulating layer disposed on the first patterned conductive layer, wherein the insulating layer comprises a plurality of first contact holes;
a second patterned conductive layer disposed on the insulating layer, the second patterned conductive layer comprising a second data line section, a source electrically connected to the second data line section, a drain, a common line, and a light-shielding pattern, wherein the light-shielding pattern is a floating metal, partially overlapping the first data line section;
a plurality of first contact plugs disposed in the first contact holes, wherein the second data line section is electrically connected to the first data line section via the first contact plugs;
a pixel electrode electrically connected to the drain; and
at least a dielectric layer disposed between the second patterned conductive layer and the pixel electrode.

11. The pixel structure of claim 10, wherein the common line and the light-shielding pattern is gapped with a space.

12. The pixel structure of claim 10, wherein the common line, the pixel electrode, and the dielectric layer disposed therebetween compose a first storage capacitor.

13. The pixel structure of claim 10, wherein the first patterned conductive layer further comprises an electrode pattern electrically connected to the drain.

14. The pixel structure of claim 13, wherein the electrode pattern, the common line, and the insulating layer disposed therebetween compose a second storage capacitor.

15. The pixel structure of claim 13, wherein the insulating layer further comprises a second contact hole disposed between the drain and the electrode pattern, and a second contact plug disposed in the second contact hole, and the electrode pattern is electrically connected to the drain via the second contact plug.

16. The pixel structure of claim 15, wherein the dielectric layer further comprises a third contact hole corresponding to the electrode pattern, the pixel electrode is filling into the third contact hole and electrically connected to the electrode pattern, and the pixel electrode is electrically connected to the drain via the electrode pattern and the second contact plug.

17. The pixel structure of claim 10, wherein the dielectric layer further comprises a third contact hole corresponding to the drain, and the pixel electrode is filling into the third contact hole and electrically connected to the drain.

18. The pixel structure of claim 10, wherein the dielectric layer comprises a single-layered dielectric layer or a multi-layered dielectric layer.

19. A pixel structure, comprising:
a scan line;
a data line crisscrossed with the scan line, the data line at least comprising a first data line section and a second data line section, wherein the first data line section comprises a first material layer, the second data line section comprises a second material layer, the first data line section and the second data line section are electrically connected together via a plurality of contact plugs;
a thin film transistor electrically connected to the scan line and the second data line section;
a light-shielding pattern disposed over the first data line section, the light-shielding pattern being a floating metal; and
a common line, parallel to the scan line, disposed between the light-shielding pattern and the thin film transistor, wherein the common line, the light-shielding pattern and the second data line section are made of a same material layer.

20. The pixel structure of claim 19, wherein the common line and the light-shielding pattern is gapped with a space.

21. The pixel structure of claim 19, further comprising a dielectric layer disposed between the common line and the pixel electrode, and wherein the common line, the pixel electrode, and the dielectric layer disposed therebetween compose a first storage capacitor.

22. The pixel structure of claim 19, further comprising an electrode pattern made of a same material as the first data line section, and wherein the electrode pattern is electrically connected to the drain.

23. The pixel structure of claim 22, further comprising an insulating layer disposed between the electrode pattern and the common line, and wherein the electrode pattern, the common line, and the insulating layer disposed therebetween compose a second storage capacitor.

24. The pixel structure of claim 23, wherein the insulating layer further comprises a second contact hole disposed between the drain and the electrode pattern, and a second contact plug disposed in the second contact hole, and the electrode pattern is electrically connected to the drain via the second contact plug.

25. The pixel structure of claim 24, wherein the dielectric layer further comprises a third contact hole corresponding to the electrode pattern, the pixel electrode is filling into the third contact hole and electrically connected to the electrode pattern, and the pixel electrode is electrically connected to the drain via the electrode pattern and the second contact plug.

26. The pixel structure of claim 21, wherein the dielectric layer further comprises a third contact hole corresponding to the drain, and the pixel electrode is filling into the third contact hole and electrically connected to the drain.

27. The pixel structure of claim 21, wherein the dielectric layer comprises a single-layered dielectric layer or a multi-layered dielectric layer.

28. A liquid crystal display panel, comprising:
a first substrate comprising the pixel structure of claim 19;
a second substrate opposite to the first substrate, wherein the second substrate comprises a patterned light-shielding matrix disposed over and corresponding to the thin film transistor, and a color filter unit disposed over and corresponding to the light-shielding pattern; and
a liquid crystal layer disposed between the first substrate and the second substrate.

* * * * *